US006171758B1

(12) United States Patent
Bhateja et al.

(10) Patent No.: US 6,171,758 B1
(45) Date of Patent: Jan. 9, 2001

(54) DIMENSIONALLY STABLE FLEXOGRAPHIC PRINTING PLATES

(75) Inventors: Sudershan K. Bhateja, Cottage Grove; John A. Martens, Dellwood; Kurt F. Feil, Lake Elmo, all of MN (US)

(73) Assignee: DuPont Operations Worldwide, Inc., Wilmington, DE (US)

( * ) Notice: Under 35 U.S.C. 154(b), the term of this patent shall be extended for 0 days.

(21) Appl. No.: 08/335,892

(22) Filed: Nov. 8, 1994

(51) Int. Cl.⁷ .................................................. G03C 1/73
(52) U.S. Cl. .................. 430/271.1; 430/306; 430/11
(58) Field of Search ............................... 430/271, 306, 430/11

(56) References Cited

U.S. PATENT DOCUMENTS

| | | |
|---|---|---|
| 2,779,684 | 1/1957 | Alles . |
| 3,264,103 | 8/1966 | Cohen et al. . |
| 3,632,726 | 1/1972 | Knox et al. . |
| 4,042,569 | 8/1977 | Bell et al. . |
| 4,076,532 | 2/1978 | Gottermeier . |
| 4,141,735 | 2/1979 | Schrader et al. . |
| 4,160,799 | 7/1979 | Locey et al. . |
| 4,275,107 | 6/1981 | Bartkus et al. . |
| 4,308,342 | 12/1981 | Limoges et al. . |
| 4,400,459 | 8/1983 | Gruetzmacher et al. . |
| 4,569,885 | 2/1986 | Yamaguchi et al. . |
| 4,661,377 | 4/1987 | Morita et al. . |
| 4,686,172 * | 8/1987 | Worns et al. ............................. 430/286 |
| 4,710,421 | 12/1987 | Ono et al. . |
| 4,725,479 | 2/1988 | Utsumi . |
| 4,756,953 | 7/1988 | Utsumi . |
| 4,799,772 | 1/1989 | Utsumi . |
| 4,847,033 | 7/1989 | Carroll, Jr. . |
| 5,015,556 | 5/1991 | Martens . |
| 5,085,976 | 2/1992 | Gibson, Jr. et al. . |
| 5,175,072 * | 12/1992 | Martens ................................... 430/286 |
| 5,187,044 | 2/1993 | Prioleau et al. . |
| 5,215,859 | 6/1993 | Martens . |
| 5,279,697 | 1/1994 | Peterson et al. . |

FOREIGN PATENT DOCUMENTS

| | | |
|---|---|---|
| 14 47 030 | 1/1969 | (DE) . |
| 0 408 197 | 1/1991 | (EP) . |

OTHER PUBLICATIONS

19809 "Method for preparing dimensionally stable polymeric film" Research Disclosure, Oct., 1980, p. 411–412.

* cited by examiner

Primary Examiner—Laura Weiner
(74) Attorney, Agent, or Firm—Thomas H. Magee

(57) ABSTRACT

The present invention is a flexographic printing plate having a very low degree of thermal distortion during development. This flexographic printing plate comprises a dimensionally stable substrate and an image bearing relief layer, wherein the thermal distortion of the flexographic printing plate in both the machine and the transverse directions is less than 0.02% when the plate is developed at temperatures in the range from about 100° C. to about 180° C.

21 Claims, No Drawings

DIMENSIONALLY STABLE FLEXOGRAPHIC PRINTING PLATES

FIELD OF THE INVENTION

The present invention relates to dimensionally stable flexographic printing plates.

BACKGROUND OF THE INVENTION

Flexography is a term broadly applicable to a printing format that uses a flexible substrate bearing an elastomeric or rubbery relief printing surface. The first flexographic printing plates were produced from natural or synthetic rubber compositions which were cured chemically under heat and pressure in a mold utilizing conventional rubber curatives such as mercapto compounds (*Flexography: Principles and Practices,* 3rd Edition, Flexographic Technical Association, p. 158–162). More recently, photopolymer elastomeric compositions (elastomer containing compositions curable upon exposure to actinic radiation) have been used to produce relief printing plates. For example, U.S. Pat. No. 4,162,919 describes the use of a photosensitive composition containing a block copolymer as an elastomeric polymeric binder, a compatible ethylenically unsaturated monomer, and a photoinitiator. Similarly, British Pat. No. 1,454,191 describes the use of an elastomeric polyurethane based photosensitive layer. In both cases, the standard solvent wash procedure is used to develop the relief layer after exposure to actinic radiation. European Pat. No. 261, 910 describes an aqueous-developable flexographic printing plate.

Both the solvent wash and aqueous wash developing systems are time consuming since drying for extended periods (1 to 24 hours) is necessary to remove entrained developer solution. In addition, these developing systems produce potentially toxic by-product wastes (both the solvent and any material carried off by the solvent, such as unreacted ethylenically unsaturated monomer) during the development process.

To avoid these problems, a thermal development process may be used. In a thermal development process, the photosensitive layer, which has been image-wise exposed to actinic radiation, is contacted with an absorbent layer at a temperature sufficient to cause the composition in the unexposed portions of the photosensitive layer to soften or melt and flow into the absorbent material. See U.S. Pat. Nos. 3,264,103, 5,015,556, and 5,279,697.

SUMMARY OF THE INVENTION

The present invention is a flexographic printing plate having a very low degree of thermal distortion during development. Specifically, according to a preferred embodiment the invention is a flexographic printing plate comprising a dimensionally stable substrate and an image bearing relief layer, wherein the thermal distortion of the flexographic printing plate in both the machine and the transverse directions is less than 0.02% when the plate is developed at temperatures in the range from about 100° C. to about 180° C.

DETAILED DESCRIPTION OF THE INVENTION

In the development of thermally developable flexographic printing plates, we have discovered that thermal distortion may become a problem, especially when precise lines, points, and images are desired by the printers who are using the plates. In response to this newly discovered problem, we have developed printing plates that can withstand the developing temperatures without undergoing a significant amount of distortion.

"Developing temperature" is the temperature to which the imagewise exposed photosensitive layer is heated to remove the uncured portions of the layer. Although a variety of methods may be used for thermal development of flexographic printing plates, one method of development uses the apparatus disclosed in U.S. Pat. No. 5,279,697. In this method, the temperature of the developing roll which contacts the absorbent material approximates the developing temperature. The substrate, which is on the opposite side from the developing roll, does not reach the developing temperature in this embodiment. In fact, the substrate may be 15 to 30° C. cooler than the developing roll. However, if other methods of thermal development are utilized the entire plate may be heated to the developing temperature.

According to a preferred embodiment the invention is a flexographic printing plate comprising a dimensionally-stable, flexible, polymeric substrate and an elastomeric, image bearing, relief layer. The thermal distortion (includes both elongation and shrinkage) of the plate in both the machine and the transverse directions is less than 0.03%, preferably less than 0.025%, more preferably less than 0.020%, when the plate is developed at temperatures between 100 and 180° C. The distortion experienced during the development of the plate at 120 to 175° C. is preferably less than 0.015%. The machine direction is the direction that the substrate film is pulled during production. The transverse direction is perpendicular to the machine direction in the plane of the substrate. Such balanced, low distortion is critical to achieving flexographic printing plates which do not introduce distortion into the image which is to be reproduced.

According to a second preferred embodiment, the invention is a flexible plate comprising a dimensionally stable, flexible, polymeric substrate and a photosensitive elastomer layer. The polymeric substrate experiences less than 0.07% distortion, preferably less than 0.05% distortion, more preferably less than 0.03% distortion, even more preferably less than 0.025%, and most preferably less than 0.02%, in any planar direction when heated to temperatures from 110 to 180° C. The distortion is desirably less than 0.02% when the film is heated to temperatures from 140 to 150° C.

The substrate may be 0.07 to 2 mm thick and is preferably 0.1 to 1.5 mm thick. While a variety of polymeric materials may be used as the substrate, semicrystalline polymers are particularly desirable because these polymeric materials are particularly amenable to stabilization by thermal annealing. Examples of semicrystalline polymers include polyethylene naphthalate (PEN), polyethylene terephthalate (PET), polyether ketone, polytetrafluoroethylene, polyamides, syndiotactic polystyrene, and polyphenylene sulfide.

The desirability of such semicrystalline polymers arises from the discovery that dimensional stability of these polymer substrates may be controlled through a special annealing process. This annealing process comprises heating the polymer substrates to temperatures above their glass transition temperature and below their melting temperature. If this annealing occurs at low tensions, very little thermal distortion will occur when the substrate is later subjected to temperatures which are less than the annealing temperature. In fact, if the substrate is later heated to temperatures less than or equal to the annealing temperature minus about 25° C. (i.e., $T_{anneal} - 25°$ C.), the thermal distortion has been found to be less than 0.05%. If the substrate is heated to temperatures less than the annealing temperature minus about 30 or 40° C. (i.e., $T_{anneal}-30$ or 40° C.), the thermal distortion has been found to be less than 0.03%. By low tensions is meant tensions less than about 200 psi ($1.4 \times 10^6$ $N/m^2$), preferably less than about 150 psi ($1.04 \times 10^6$ $N/m^2$), and more preferably less than about 100 pounds per square inch ($6.9 \times 10^5$ $N/m^2$). High tension annealing causes distortions. Various annealing methods may be used including air-oven annealing, hot can annealing, annealing rolls of films, or combinations of methods.

The time required for annealing will depend upon the annealing method employed, the polymeric material of the film, film thickness, etc. With regard to the method of annealing, heat transfer by conduction, as occurs in hot can annealing, is more efficient than by convection, as occurs in air oven annealing. Thus, the annealing time for air oven annealing will be longer than that needed for hot can annealing. As an example, for annealing a 7 mil PET film in a forced air oven at 180° C., annealing times as low as 60 seconds were found to be sufficient to impart dimensional stability to the film. In general, however, for any given annealing method, the annealing time should be greater than the time required to bring the film to the annealing temperature (referred to hereinafter as "$t_h$"), preferably $t_h+5$ seconds, more preferably $t_h+10$ seconds, and most preferably $t_h+15$ seconds.

Thus, by annealing the substrates to preferably at least 25° C., more preferably at least 30° C., and most preferably at least 40° C., higher than the temperature the substrates experience during thermal development of the flexographic printing plate, the distortion of the printing plate during thermal development is significantly decreased. For plates being thermally developed using the apparatus of U.S. Pat. No. 5,279,697, the substrate should preferably be annealed at temperatures no less than about 10° C. below the developing temperature as approximated by the temperature of the developing roller (i.e. $T_{developing}-10°$ C.), more preferably no less than the developing temperature, and most preferably no less than the developing temperature plus 15° C.

Thermal development of preferred flexographic printing plates occurs by contacting a plate which has been imagewise exposed to radiation to an absorbent material on a developing roll. Typically, temperatures of the developing roll are in the range of 100 to 180° C. For A-B-A block copolymer type photosensitive materials as described below and in copending U.S. application Ser. No. 08/188,450, the developing roll temperature is preferably 120 to 150° C. Thus, for production of these plates, annealing of the substrate is preferably done at low tensions and at temperatures greater than 120° C., more preferably greater than 150° C., and most preferably greater than 175° C. For urethane type photosensitive materials as described below and in U.S. Pat. No. 5,015,556, the developing roll temperature is preferably about 150 to 175° C. Thus, for production of these plates, annealing of the substrate is preferably done at low tensions and at temperatures greater than 150° C., more preferably greater than 175° C., and most preferably greater than 200° C. However, even annealing below the developing temperature provides some improvement in shrinkage over substrates that are not annealed. Note that for certain semicrystalline polymeric materials annealing at too high a temperature may cause problems such as wrinkling. For example, polyethylene terephthalate (PET) has been found to wrinkle when annealed at 220° C.

The substrate optionally may be surface treated for better adhesion. Examples of surface treatments include coating the surface with MSOL (an amorphous porous silica with silane coupling agent) as described in U.S. Pat. No. 5,204,219 or corona treating the surface followed by use of a primer such as an aziridene, as described in U.S. Pat. No. 5,187,044.

The photosensitive, elastomeric layer should be at least 0.3 mm thick but no more than 3.0 mm thick, preferably no more than 1.5 mm. The photosensitive elastomeric composition preferably is suitable for thermal development, i.e., the uncured elastomeric composition must soften or melt at a reasonable processing or developing temperature but not be subject to cold flow, i.e., dimensional change, during normal storage.

A non-limiting example of such an elastomeric composition comprises a thermoplastic elastomeric block copolymer mixed with a cross-linking agent and a photoinitiator. The elastomeric block copolymer is preferably an A-B-A type block copolymer, where A is a nonelastomeric block, preferably a vinyl polymer and most preferably polystyrene and B is an elastomeric block, preferably polybutadiene or polyisoprene. The nonelastomer to elastomer ratio is preferably in the range of from 10:90 to 35:65. The cross-linking agent in this embodiment may be an ethylenically unsaturated compound with at least one terminal ethylenic group that is compatible with the block copolymer, e.g. multifunctional acrylates or methacrylates, or polyacryloyl oligomers. The following compounds are illustrative of, but not an exhaustive list of, suitable cross-linking agents: ethylene glycol diacrylate, hexanediol diacrylate, diethylene glycol diacrylate, glycerol diacrylate, trimethylol propane triacrylate, hexanediol dimethacrylate, glycerol triacrylate, trimethylolpropane triacrylate, ethylene glycol dimethacrylate, 1,3-propanediol dimethacrylate, 1,2,4-butanetriol trimethacrylate, and 1,4-butanediol diacrylate. For a more exhaustive list of suitable compounds see U.S. Pat. No. 4,400,459. A mixture of mono-functional and multi-functional acrylates or methacrylates may be used. However, if using such a mixture, it is desirable to have an average of at least 1.3 acrylate groups per molecule of cross-linking agent. It is preferable to have an average of at least 1.7 acrylate groups per molecule of cross-linking agent, and it is most preferable to have at least 2.1 acrylate groups per molecule of cross-linking agent. If a polyacryloyl oligomer is used, that oligomer should preferably have a molecular weight greater than 1000.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete discussion of some of these materials see U.S. Pat. No. 5,015,556.

The photosensitive elastomeric layer should include a photoinitiator. The photoinitiator is a compound which generates free radicals upon exposure to actinic radiation. Any of the known classes of photoinitiators, particularly free radical photoinitiators such as quinones, benzophenones, benzoin ethers, aryl ketones, peroxides, biimidazoles, diaryliodoniums, triarylsulfoniums and phosphoniums, and diazoniums, may be used. Alternatively, the photoinitiator may be a mixture of compounds, one of which provides the free radicals when caused to do so by a sensitizer activated by radiation, may be used.

Additional additives to the photosensitive layer include colorants, processing aids, antioxidants, and antiozonants. Processing aids may be such things as low molecular weight polymers compatible with the elastomeric block copolymer, such as a low molecular weight α-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The release layer must be flexible, transparent, coatable, and nontacky. A thin layer, preferably having a thickness of at least 0.5 microns, but less than 10 microns, more preferably less than 4 microns, is suitable.

The release layer preferably is removable by contact with an absorbent material in the range of acceptable developing temperatures for the flexographic plate used. Suitable release layers may include polyamides and hydroxy cellulosic polymers.

Additional intermediate photosensitive layers may be used to adjust adhesion, hardness, and thickness of the flexographic printing plate.

EXAMPLES

Example 1

Five mil (0.12 mm) polyethylene nahpthalate (PEN) films (Kaladex 1,030 from ICI) were cut into 15"×20" (38.1 cm×50.8 cm) pieces. One film piece was not heated treated. This sample was the control. The other film pieces were annealed in a forced air oven for 5 minutes at various temperatures ranging from 140 to 200° C. Specimens (1"× 13"0 or 2.54 cm×33.02 cm) were cut from the different films. The specimens were cut in both the machine and transverse directions. Two ink marks about 10.6" (26.9 cm) apart were made on each specimen. The distance between ink marks was measured with a Confirmer Travelling Microscope. The specimens were then heated at 150° C. for 15 minutes. The distance between the ink marks was then remeasured and the distortion calculated. For each annealing temperature, two different specimens were measured for each direction. As set forth in Table I, all of the annealed specimens showed much less shrinkage in both the machine and transverse directions than did the control samples. The amount of distortion was well balanced between the machine and transverse directions. Samples that had been annealed close to or above the test temperature had the best thermal dimensional stability in terms of magnitude distortion and balance of distortion in the two directions.

TABLE 1

| SAMPLE | ANNEALING TEMPERATURE (° C.) | DISTORTION (%) machine dir. | DISTORTION (%) transverse dir. |
|---|---|---|---|
| Control | — | 0.354 | — |
| Control | — | 0.389 | — |
| Control | — | — | 0.324 |
| Control | — | — | 0.326 |
| Control | — | — | 0.306 |
| A-1 | 140 | 0.086 | — |
| A-1 | 140 | 0.098 | — |
| A-1 | 140 | 0.061 | — |
| A-1 | 140 | — | 0.080 |
| A-1 | 140 | — | 0.063 |
| A-1 | 140 | — | 0.063 |
| A-2 | 160 | 0.009 | — |
| A-2 | 160 | 0.018 | — |
| A-2 | 160 | — | 0.029 |
| A-2 | 160 | — | 0.046 |
| A-2 | 160 | — | 0.013 |
| A-3 | 180 | −0.001 | — |
| A-3 | 180 | 0.013 | — |
| A-3 | 180 | 0.009 | — |
| A-3 | 180 | — | 0.023 |
| A-3 | 180 | — | 0.020 |
| A-3 | 180 | — | 0.024 |
| A-4 | 200 | −0.001 | — |
| A-4 | 200 | 0.001 | — |
| A-4 | 200 | 0.011 | — |
| A-4 | 200 | — | 0.012 |
| A-4 | 200 | — | 0.001 |
| A-4 | 200 | — | 0.014 |

Example 2

Four PEN film samples were prepared. Two of the films had not been heat treated and served as the control. Two films had been annealed as in Example 1 for 5 minutes at 170° C. All the films, after any annealing was done, were inscribed with four straight lines 15 in. long (38.1 cm). One line was drawn along the transverse direction of the PEN film and this line was designated as the 0° line. The three additional lines were drawn at angles of 45°, 90°, and 135° from the 0° line. The film samples were cycled nine times through a flexographic plate thermal developer (as disclosed in U.S. Pat. No. 5,279,697) in which the developer roll was set at 176° C. and the transport drum (which contacts the substrate) was set at 65° C. The change of length of each line was measured and the percentage distortion was calculated. Table II shows that the annealed films displayed significantly less distortion than did the control films in all directions.

TABLE II

| SAMPLE | POSITION | DISTORTION (%) |
|---|---|---|
| Control 1 | 0° | −0.106 |
| Control 2 | 0° | −0.152 |
| Annealed 1 | 0° | −0.005 |
| Annealed 2 | 0° | −0.006 |
| Control 1 | 45° | −0.122 |
| Control 2 | 45° | −0.124 |
| Annealed 1 | 45° | 0.004 |
| Annealed 2 | 45° | −0.021 |
| Control 1 | 90° | −0.030 |
| Control 2 | 90° | −0.069 |
| Annealed 1 | 90° | 0.005 |
| Annealed 2 | 90° | −0.007 |
| Control 1 | 135° | −0.070 |
| Control 2 | 135° | −0.093 |
| Annealed 1 | 135° | −0.007 |
| Annealed 2 | 135° | −0.009 |

Example 3

Flexographic printing plates were produced using various PEN film substrates. Four of the plates produced had standard 5 mil (0.127 mm) Kaladex™ brand PEN substrates. Three plates were produced using the same type of PEN film, but after the film had been annealed at 170° C. for 5 minutes. The substrates were corona discharge treated and coated with an aziridene primer as disclosed in U.S. Pat. No. 5,187,044. Then a 35 mil urethane photopolymer, as disclosed in U.S. Pat. No. 5,215,859 Example 1A, was laminated onto the primed films between two rolls heated to 110° C. The laminates were exposed to e-beam irradiation through the substrate to set the floor. The laminates were next image wise exposed to UV radiation through a GATF Register test grid negative for 3 minutes. The image wise exposed plates were passed through 6 cycles on the thermal developer. The developer roll was maintained at 177° C. while the transport roll, which is in direct contact with the substrate, was maintained at 65° C. The magnitude of distortion in the machine and transverse directions was determined by measuring the developed image on the flexographic printing plates versus the image on the negative. Negative distortion values refer to shrinkage and positive values refer to expansion. Table III shows the average distortion results for the control plates and the plates with annealed substrates. These results demonstrate that the plates produced from the annealed PEN films have lower distortion than do plates produced with unannealed substrates.

TABLE III

| Sample | Distortion (%)* | |
| --- | --- | --- |
|  | machine direction | transverse direction |
| Control** | −0.0333 | −0.0131 |
| Annealed*** | −0.0086 | 0.0066 |

*Average of 3 measurements in each direction.
**Average for 4 plates.
***Average for 3 plates.

Example 4

Flexographic printing plates were also produced using both thermally annealed and non-annealed 7-mil (0.178 mm) polyethylene terephthalate (PET) film substrates. The thermally annealed film was produced on-line in an air oven held at about 160° C. with a web tension of about 100 psi ($6.9 \times 10^5$ N/m$^2$). The film substrates were corona treated and primed as in Example 3. Approximately 18"×20" (45.7 cm×50.8 cm) treated film specimens were laminated with a 60 mil thick Kraton™ based photosensitive elastomeric composition. The plate specimens were then imaged through a negative having an x-y grid and 45° angle lines. The imaged plates were developed by cycling 6 times through the processor of U.S. Pat. No. 5,279,697. The developer roll was at 176° C. and the transport drum was at 65° C. Some plates were fed through the thermal developer unit in the machine direction, while others were fed crosswise (or in the transverse direction) through the processor. The magnitude of plate distortion was calculated with respect to the negative by measuring changes in a grid, 12 inch (30.5 cm) in the machine direction (MD) and 10 inch (25.4 cm) in the transverse direction (TD). For each plate three different measurements were made in each direction. Negative distortion values refer to shrinkage and positive values refer to expansion. The data shown in Table IV demonstrates that plates produced with annealed PET substrates exhibit lower distortion than plates produced with non-annealed PET substrates.

TABLE IV

| SAMPLE | PROCESSING DIRECTION | DISTORTION (%)* | |
| --- | --- | --- | --- |
|  |  | MD | TD |
| Annealed-1 | Machine | 0.007 | 0.007 |
| Annealed-2 | Machine | −0.014 | −0.007 |
| Annealed-3 | Machine | 0.008 | 0.013 |
| Annealed-4 | Machine | −0.014 | −0.008 |
| Annealed-5 | Cross | −0.007 | −0.006 |
| Annealed-6 | Cross | −0.025 | 0.023 |
| Annealed-7 | Cross | −0.011 | −0.014 |
| Control-1** | Machine | −0.073 | −0.051 |
| Control-2** | Cross | −0.053 | −0.037 |

*Average of 3 measurements in each direction for each plate
**Average of 3 plates

What is claimed is:

1. A photosensitive plate suitable for use as a flexographic printing plate comprising a dimensionally stable, flexible, polymeric substrate and a photosensitive elastomer layer, wherein the plate has a thermal distortion in both the machine and the transverse directions which is less than 0.03% when the plate is exposed to actinic radiation and, after exposure, is developed at temperatures between 100 and 180° C.

2. The plate of claim 1 wherein the thermal distortion is less than 0.015% when the plate is developed at temperatures from 120 to 175° C.

3. The plate of claim 1 wherein the substrate has a thickness from 0.07 to 2 mm.

4. The plate of claim 1 wherein the photosensitive elastomer layer comprises a thermoplastic elastomeric block copolymer mixed with a cross-linking agent and a photoinitiator.

5. The plate of claim 4 wherein the elastomeric block copolymer is an A-B-A type block copolymer, where A is a vinyl polymer and B is polybutadiene or polyisoprene and the ratio A:B is in the range of from 10:90 to 35:65, and the cross-linking agent is an ethylenically unsaturated compound with at least one terminal ethylenic group that is compatible with the block copolymer.

6. The plate of claim 1 wherein the photosensitive elastomer layer comprises a polyurethane elastomer which is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups.

7. The plate of claim 1 wherein the polymeric substrate is a semicrystalline polymer.

8. The plate of claim 7 wherein the semicrystalline polymer is selected from the group consisting of: polyethylene naphthalate, polyethylene terephthalate, polyether ketone, polytetrafluoroethylene, polyamide, syndiotactic polystyrene, and polyphenylene sulfide.

9. The plate of claim 7 wherein the semicrystalline polymer substrate has been annealed at tensions less than $1.4 \times 10^6$ N/m$^2$ and a temperature, which is between the glass transition temperature and the melting temperature and is greater than the developing temperature minus 10° C.

10. The plate of claim 9 wherein the annealing temperature is greater than the developing temperature plus 15° C.

11. The plate of claim 9 wherein the annealing temperature is greater than the developing temperature.

12. The plate of claim 9 wherein the annealing temperature is greater than 120° C.

13. The plate of claim 9 wherein the annealing temperature is greater than 150° C.

14. The plate of claim 9 wherein the annealing temperature is greater than 175° C.

15. The plate of claim 9 wherein the annealing is performed at tensions of less than $6.9 \times 10^5$ N/m$^2$.

16. The plate of claim 9 in which the substrate has been annealed for a time greater than the time it takes for the substrate to reach the annealing temperature.

17. The plate of claim 9 wherein the polymer substrate is annealed for a time greater than the time required to reach the annealing temperature plus 5 seconds.

18. The plate of claim 12 in which the polymer substrate is annealed by air-oven annealing, hot can annealing, annealing rolls of film, or combinations of these methods.

19. A photosensitive plate suitable for use as a flexographic printing plate comprising a dimensionally stable, flexible, polymeric substrate and a photosensitive elastomer layer, wherein said polymeric substrate experiences less than 0.07% distortion in any planar direction when heated to temperatures from 110 to 180° C.

20. The plate of claim 19 wherein the substrate experiences less than 0.05% distortion in any planar direction when heated to temperatures from 110 to 180° C.

21. The plate of claim 19 wherein the substrate experiences less than 0.02% distortion in any planar direction when heated to temperatures from 110 to 180° C.

\* \* \* \* \*